(12) United States Patent
Goto et al.

(10) Patent No.: US 11,668,009 B2
(45) Date of Patent: Jun. 6, 2023

(54) COMPOSITE MEMBER

(71) Applicants: Sumitomo Electric Industries, Ltd., Osaka (JP); A.L.M.T. Corp., Tokyo (JP)

(72) Inventors: Kengo Goto, Osaka (JP); Tomoaki Ikeda, Osaka (JP); Akihisa Hosoe, Osaka (JP); Masanori Sugisawa, Sakata (JP); Fukuto Ishikawa, Sakata (JP); Hideaki Morigami, Toyama (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 8 days.

(21) Appl. No.: 16/969,238

(22) PCT Filed: Jan. 30, 2019

(86) PCT No.: PCT/JP2019/003137
§ 371 (c)(1),
(2) Date: Aug. 12, 2020

(87) PCT Pub. No.: WO2019/159694
PCT Pub. Date: Aug. 22, 2019

(65) Prior Publication Data
US 2021/0002769 A1    Jan. 7, 2021

(30) Foreign Application Priority Data
Feb. 14, 2018   (JP) .............................. JP2018-023823

(51) Int. Cl.
*C23C 18/16* (2006.01)
*C23C 18/18* (2006.01)
(Continued)

(52) U.S. Cl.
CPC .......... *C23C 18/1651* (2013.01); *B32B 15/04* (2013.01); *B32B 15/043* (2013.01);
(Continued)

(58) Field of Classification Search
CPC ............ C23C 18/1651; C23C 18/1637; C23C 18/1803; C23C 18/1827; C23C 18/1844;
(Continued)

(56) References Cited

U.S. PATENT DOCUMENTS

2005/0051891 A1   3/2005   Yoshida et al.
2016/0336253 A1*  11/2016  Fukui ...................... B22F 7/008
2017/0145280 A1   5/2017   Morikawa et al.

FOREIGN PATENT DOCUMENTS

CN     106995896 A    8/2017
EP       1976004 A1   10/2008
(Continued)

*Primary Examiner* — Michael E. La Villa
(74) *Attorney, Agent, or Firm* — Faegre Drinker Biddle & Reath LLP

(57) ABSTRACT

A composite member includes: a substrate formed of a composite material containing a plurality of diamond grains and a metal phase; and a coating layer made of metal. The surface of the substrate includes a surface of the metal phase, and a protrusion formed of a part of at least one diamond grain of the diamond grains and protruding from the surface of the metal phase. In a plan view, the coating layer includes a metal coating portion, and a grain coating portion. A ratio of a thickness of the grain coating portion to a thickness of the metal coating portion is equal to or less than 0.80. The coating layer has a surface roughness as an arithmetic mean roughness Ra of less than 2.0 μm.

3 Claims, 7 Drawing Sheets

(51) Int. Cl.
- *C23C 26/00* (2006.01)
- *C23C 18/50* (2006.01)
- *C22C 26/00* (2006.01)
- *B32B 15/04* (2006.01)
- *H01L 23/373* (2006.01)
- *C22C 1/04* (2023.01)
- *C22C 1/05* (2023.01)
- *C22C 5/06* (2006.01)
- *C23C 18/32* (2006.01)
- *H01L 21/48* (2006.01)
- *B32B 19/00* (2006.01)
- *B32B 15/16* (2006.01)
- *B32B 19/04* (2006.01)
- *B22F 7/02* (2006.01)

(52) U.S. Cl.
CPC .............. *B32B 15/16* (2013.01); *B32B 19/00* (2013.01); *B32B 19/041* (2013.01); *C22C 1/0466* (2013.01); *C22C 1/05* (2013.01); *C22C 5/06* (2013.01); *C22C 26/00* (2013.01); *C23C 18/1637* (2013.01); *C23C 18/1803* (2013.01); *C23C 18/1827* (2013.01); *C23C 18/1844* (2013.01); *C23C 18/1879* (2013.01); *C23C 18/32* (2013.01); *C23C 18/50* (2013.01); *H01L 21/4871* (2013.01); *H01L 23/3732* (2013.01); *H01L 23/3736* (2013.01); *B22F 7/02* (2013.01); *B22F 2998/10* (2013.01); *B22F 2999/00* (2013.01); *B32B 2255/06* (2013.01); *B32B 2255/205* (2013.01); *B32B 2255/28* (2013.01); *Y10T 428/12493* (2015.01); *Y10T 428/12535* (2015.01); *Y10T 428/12625* (2015.01); *Y10T 428/12868* (2015.01); *Y10T 428/12875* (2015.01); *Y10T 428/12944* (2015.01); *Y10T 428/12993* (2015.01)

(58) Field of Classification Search
CPC ..... C23C 18/1879; C23C 18/32; C23C 18/50; B32B 2255/205; B32B 2255/28; B32B 15/04; B32B 15/043; B32B 15/16; B32B 19/041; B32B 19/00; C22C 1/0466; C22C 1/05; C22C 5/06; C22C 26/00; H01L 21/4871; H01L 23/3732; H01L 23/3736; B22F 7/02; B22F 2998/10; B22F 2999/00; B22F 2003/247; B22F 2003/244; B22F 2003/242; Y10T 428/12493; Y10T 428/12535; Y10T 428/12625; Y10T 428/12896; Y10T 428/12944; Y10T 428/12993; Y10T 428/12868; Y10T 428/12875

See application file for complete search history.

(56) References Cited

FOREIGN PATENT DOCUMENTS

| | | |
|---|---|---|
| EP | 3206227 A1 | 8/2017 |
| JP | 2004-197153 A | 7/2004 |
| JP | 2005-175006 A | 6/2005 |
| JP | 2005-184021 A | 7/2005 |
| JP | 2012-086304 A | 5/2012 |
| JP | 2012-117085 A | 6/2012 |
| WO | WO-2016/035795 A1 | 3/2016 |

* cited by examiner

COMPOSITE MEMBER

TECHNICAL FIELD

The present disclosure relates to a composite member and a method of manufacturing a composite member. The present application claims a priority based on Japanese Patent Application No. 2018-023823 filed on Feb. 14, 2018, the entire content of which is incorporated herein by reference.

BACKGROUND ART

As a material suitable for a heat dissipation member in a semiconductor element, PTLs 1 and 2 each disclose a composite material of a diamond and metal such as silver (Ag) and copper (Cu). PTLs 1 and 2 also disclose that a metal coating is formed by plating, vacuum deposition and the like on the surface of a substrate made of the composite material.

A semiconductor element and a heat dissipation member are generally joined with solder. In the case where the heat dissipation member is formed of the above-mentioned composite material of a diamond and metal, particularly a diamond is inferior in wettability to solder. Thus, the above-mentioned metal coating is formed as an underlying layer of solder on the surface of the substrate formed of the composite material.

CITATION LIST

Patent Literature

PTL 1: Japanese Patent Laying-Open No. 2004-197153
PTL 2: WO2016/035795

SUMMARY OF INVENTION

A composite member according to one embodiment of the present disclosure includes:
  a substrate formed of a composite material containing
    a plurality of diamond grains, and
    a metal phase that bonds the diamond grains; and
  a coating layer made of metal and coating at least a part of a surface of the substrate, wherein
    the surface of the substrate includes
      a surface of the metal phase, and
      a protrusion formed of a part of at least one diamond grain of the diamond grains and protruding from the surface of the metal phase,
    in a plan view, the coating layer includes
      a metal coating portion coating the surface of the metal phase, and
      a grain coating portion coating the protrusion and not coating the surface of the metal phase,
    a ratio of a thickness of the grain coating portion to a thickness of the metal coating portion is equal to or less than 0.80, and
    the coating layer has a surface roughness as an arithmetic mean roughness Ra of less than 2.0 μm.

A method of manufacturing a composite member according to one embodiment of the present disclosure includes:
  etching a surface of a material plate formed of a composite material containing a plurality of diamond grains and a metal phase that bonds the diamond grains, to produce a rough surface plate in which a part of at least one diamond grain of the diamond grains protrudes from a surface of the metal phase;

subjecting the rough surface plate to first electroless plating to produce a partial coating plate in which a first plating layer is formed on the surface of the metal phase while exposing a part of at least one diamond grain of the diamond grains existing on the surface of the material plate; and
  subjecting the partial coating plate to second electroless plating to form a second plating layer that coats
    a surface of the first plating layer and
    a portion of at least one diamond grain of the diamond grains that is exposed from the surface of the first plating layer.

DETAILED DESCRIPTION

Figure 1:
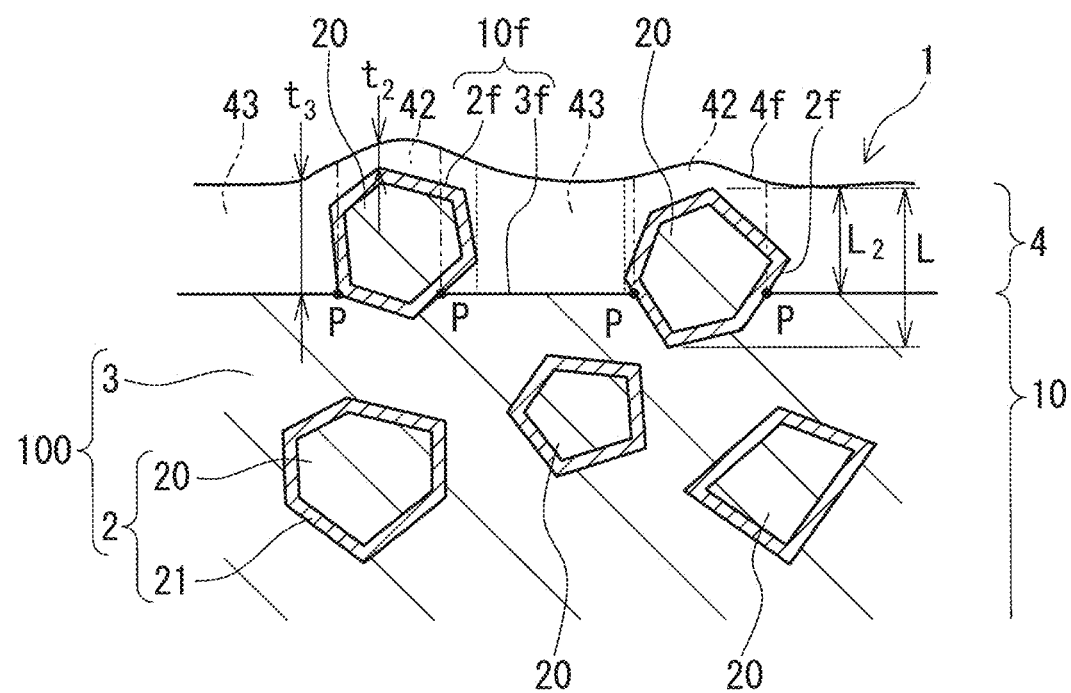
FIG. 1 is a schematic partial cross-sectional view schematically showing a composite member of an embodiment.
Figure 2:
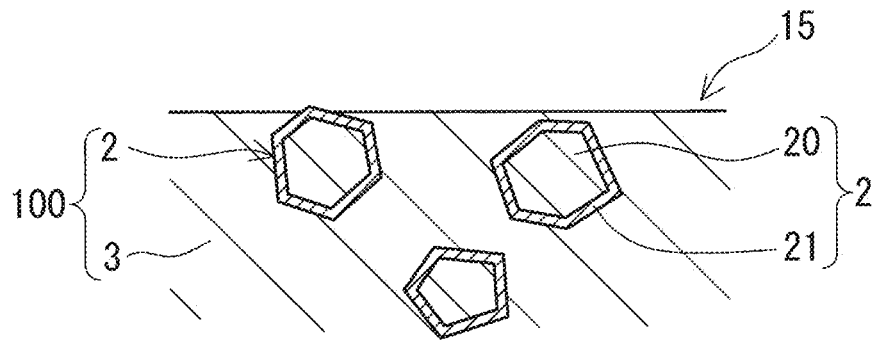
FIG. 2 is a step explanatory diagram illustrating a method of manufacturing a composite member of the embodiment.

Problem to be Solved by the Present Disclosure

When a substrate formed of a composite material made of a diamond and metal is utilized for a heat dissipation member and the like in a semiconductor element, it is desirable to achieve excellent thermal conductivity in the state where the semiconductor element is joined with solder or the like to the substrate that is attached to an installation target such as a cooling device. In order to construct such a heat dissipation structure, it is desirable that a metallic coating layer provided on the substrate has a smooth surface but is still less likely to peel off from the substrate.

In this case, the semiconductor element and the heat dissipation member are configured representatively by sequentially arranging a semiconductor element, solder, a heat dissipation member, grease, an installation target, and a heat dissipation fin. For example, when the substrate forming a heat dissipation member has a smooth surface, the coating layer is also readily formed to have a smooth surface along the surface of this substrate. When the coating layer has a smooth surface, solder or grease is readily formed to have a uniform thickness on the coating layer. Solder and grease are lower in coefficient of thermal conductivity than the substrate. Thus, solder or grease having uniform thickness serves to suppress local increase in thermal resistance resulting from a locally thick portion of such solder or grease, with the result that the thermal conductivity is more likely to be increased. However, the smooth surface of the substrate leads to poor adhesiveness between the substrate and the coating layer, with the result that the coating layer is more likely to peel off from the substrate. In particular, under a thermal history, the coating layer is more likely to peel off from the substrate, as will be described below. When the coating layer peels off, the heat of the semiconductor element is difficult to be dissipated from the heat dissipation member to an installation target, which leads to lower thermal conductivity.

On the other hand, for example, when the substrate forming a heat dissipation member has a rough surface with large projections and recesses, the proportion that the coating layer coats the diamond grains on the surface of the substrate can be increased. Thereby, the adhesiveness between the substrate and the coating layer is improved. However, solder and grease are provided so as to level the above-mentioned large projections and recesses, thereby forming a locally thick portion in solder and grease. This locally thick portion increases local thermal resistance, which may cause a failure in a semiconductor element. When this coating layer is increased in thickness to some extent, the projections and recesses on the surface of the coating layer may be able to be reduced in size to some extent, which however leads to lower thermal conductivity. This is because a relatively thick coating layer that is lower in thermal conductivity than a diamond exists on diamond grains having high coefficient of thermal conductivity.

Thus, one object is to provide a composite member including a coating layer that has a smooth surface and is still less likely to peel off from a substrate. Also, another object is to provide a method of manufacturing a composite member, by which a composite member including a coating layer that has a smooth surface and is still less likely to peel off from a substrate can be manufactured.

Advantageous Effect of the Present Disclosure

According to the composite member, the coating layer has a smooth surface but is still less likely to peel off from a substrate.

According to the method of manufacturing a composite member, a composite member including a coating layer that has a smooth surface and is still less likely to peel off from a substrate can be manufactured.

DESCRIPTION OF EMBODIMENTS

First, the details of the embodiments of the present disclosure will be listed below for explanation.

(1) A composite member according to one embodiment of the present disclosure includes:
a substrate formed of a composite material containing
a plurality of diamond grains, and
a metal phase that bonds the diamond grains; and
a coating layer made of metal and coating at least a part of a surface of the substrate, wherein
the surface of the substrate includes
a surface of the metal phase, and
a protrusion formed of a part of at least one diamond grain of the diamond grains and protruding from the surface of the metal phase,
in a plan view, the coating layer includes
a metal coating portion coating the surface of the metal phase, and
a grain coating portion coating the protrusion and not coating the surface of the metal phase,
a ratio of a thickness of the grain coating portion to a thickness of the metal coating portion is equal to or less than 0.80, and
the coating layer has a surface roughness as an arithmetic mean roughness Ra of less than 2.0 μm.

A method of measuring the thickness of the grain coating portion, the thickness of the metal coating portion, and the surface roughness will be described in detail in the description of test example 1 as below.

The coating layer is made of metal and coats the metal phase and the diamond grains, which each exist as the surface of the substrate, while the coating layer is in direct contact with the metal phase and the diamond grains.

The composite member includes a coating layer having a smooth surface with very small surface roughness Ra. Accordingly, when the composite member is used for a heat dissipation member and the like in a semiconductor element, a joining material such as solder and grease each are readily formed to have a uniform thickness on the coating layer. Thus, the composite member is excellent in thermal conductivity since it suppresses local increase in thermal resistance resulting from a locally thick portion formed in solder, grease and the like.

Furthermore, in the composite member, a part of at least one diamond grain of the diamond grains protrudes from the metal phase on the surface of the substrate. Thus, the surface of the metal phase exists in a recessed state between the protrusions of the diamond grains. The coating layer coats the surface of the substrate having projections and recesses that are formed by the protrusions of the diamond grains and the surface of the metal phase. Accordingly, in a plan view, the coating layer includes: a portion substantially coating only the protrusions (a grain coating portion); and a portion coating at least the surface of the metal phase (a metal coating portion). Since the coating layer has a smooth surface as described above, the thickness of the grain coating portion coating the projections on the substrate is less than the thickness of the metal coating portion coating the recesses of the substrate. The ratio between these thicknesses is equal to or less than 0.80. When the above-mentioned composite member is used for a heat dissipation member and the like in a semiconductor element, a relatively thin grain coating portion exists between the diamond grains on the surface of the substrate and the semiconductor element, the installation target or the like. Thus, the heat of the semiconductor element can be efficiently dissipated to the installation target, thereby achieving more excellent thermal conductivity.

In addition, the protrusions of the diamond grains are embedded in the coating layer, and the coating layer is located to surround the protrusions. This increases the proportion that the coating layer coats each diamond grain, thereby enhancing the adhesion force between the diamond grains and the coating layer by the so-called anchor effect. Accordingly, the composite member is excellent in adhesiveness between the substrate and the coating layer, and therefore, the coating layer is less likely to peel off from the substrate. In particular, even when the composite member is used for a heat dissipation member and the like in a semiconductor element and subjected to a thermal history, for example, soldered in a manufacturing process or subjected to a hot-cold cycle while being used as a heat dissipation member, the coating layer is less likely to peel off from the substrate, thereby achieving excellent thermal conductivity for a long period of time.

(2) As an exemplary embodiment of the composite member, metal that forms the metal phase is silver or a silver alloy.

Since silver or a silver alloy is higher in coefficient of thermal conductivity than copper, aluminum or the like, the above-mentioned embodiment is more excellent in thermal conductivity.

(3) As an exemplary embodiment of the composite member, the metal that forms the coating layer is a nickel alloy containing phosphorus.

In this case, since a diamond is non-conductive, the coating layer is formed by utilizing a method not requiring electricity conduction to a substrate, for example, such as electroless plating and vacuum deposition. The above-mentioned embodiment allows formation of a coating layer by electroless plating in the manufacturing process. Thus, the substrate has a surface with projections and recesses, but a plating layer having a uniform thickness can be formed on the surface of this substrate.

(4) A method of manufacturing a composite member according to one embodiment of the present disclosure includes:

etching a surface of a material plate formed of a composite material containing a plurality of diamond grains and a metal phase that bonds the diamond grains, to produce a rough surface plate in which a part of at least one diamond grain of the diamond grains protrudes from a surface of the metal phase;

subjecting the rough surface plate to first electroless plating to produce a partial coating plate in which a first plating layer is formed on the surface of the metal phase while exposing a part of at least one diamond grain of the diamond grains existing on the surface of the material plate; and subjecting the partial coating plate to second electroless plating to form a second plating layer that coats a surface of the first plating layer and a portion of at least one diamond grain of the diamond grains that is exposed from the surface of the first plating layer.

The present inventors have etched a material plate formed of a composite material made of diamond grains and metal to thereby roughen the surface of the material plate, which was then subjected once to electroless plating, thereby forming one plating layer having a thickness enough to embed the diamond grains in this one plating layer. As a result, the inventors have found that the larger surface roughness of the material plate leads to a rougher surface of the plating layer along this material plate, whereas the smaller surface roughness of the material plate leads to a plating layer that is more likely to peel off from the material plate (see test example 1 as described below). Thus, as a result of review of various plating conditions, the inventors have found it preferable to perform electroless plating twice. The above-mentioned method of manufacturing a composite member is based on these findings.

According to the method of manufacturing a composite member, a material plate is first etched to thereby cause a part of at least one diamond grain of diamond grains existing near the surface of the material plate to protrude from the surface of a metal phase, to produce a rough surface plate having projections and recesses formed by protrusions of the diamond grains and the surface of the metal phase existing in a recessed state between the protrusions. Preferably, a rough surface plate is produced that includes a large number of protrusions of diamond grains that protrude greatly to some extent from the surface of the metal phase (see the ratio of a protrusion height $L_2$ described later). Then, by first electroless plating, the first plating layer is formed mainly on the metal phase so as to fill the recesses of the rough surface plate to some extent and so as to expose a part of each diamond grain that protrudes greatly to some extent as described above. In other words, the first plating layer is formed so as to coat the metal phase and the less protruding diamond grains and to surround the more protruding diamond grains. The surface of the partial coating plate including the first plating layer formed in this way has the recesses levelled by the first plating layer so as to be smooth with surface roughness smaller than that of the rough surface plate. Then, by second electroless plating, the second plating layer is formed so as to coat the surface of the partial coating plate, specifically, a portion of at least one diamond grain of the diamond grains that is exposed from the first plating layer and the surface of the first plating layer. This second plating layer has a relatively smooth surface with small surface roughness along the above-mentioned smooth surface of the partial coating plate. In addition, the protrusion of at least one diamond grain of the diamond grains that protrudes greatly to some extent from the surface of the metal phase is coated with both the first plating layer and the second plating layer and embedded therein, in which case a relatively large proportion of each diamond grain is coated with the plating layer. Such plating layers are less likely to peel off from the substrate formed of the composite material, and therefore, can be recognized as excellent in adhesiveness.

Accordingly, the method of manufacturing a composite member allows manufacturing of a composite member including a coating layer (the above-mentioned plating layer) that has a smooth surface but is less likely to peel off from the substrate, and representatively, the composite member described in the above (1). This composite member is excellent in thermal conductivity as described above and can be utilized suitably for a heat dissipation member and the like in a semiconductor element.

Details of Embodiment of the Present Disclosure

In the following, the embodiments of the present disclosure will be specifically described with reference to the accompanying drawings as appropriate, in which the same reference characters indicate the same components.

FIGS. 1 to 5 each are a partial cross-sectional view schematically showing a coating layer 4 and therearound in the state where a composite member 1 is cut along a plane in parallel with the thickness direction of composite member 1 (the direction in which substrate 10 and coating layer 4 are stacked, i.e., the up-down direction in each figure). Each diamond grain 20 is shown in an exaggerated manner for the sake of illustration. Also, coating layer 4 is not hatched with oblique lines for the sake of illustration.

Figure 6:
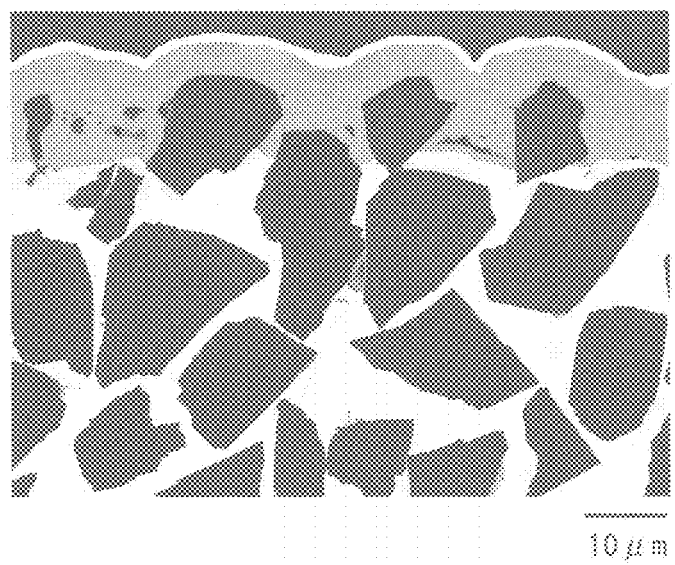
FIG. 6 is a microphotograph of a cross section of a composite member of sample No. 1 produced in test example 1 and taken by a scanning electron microscope (SEM).
Figure 7:
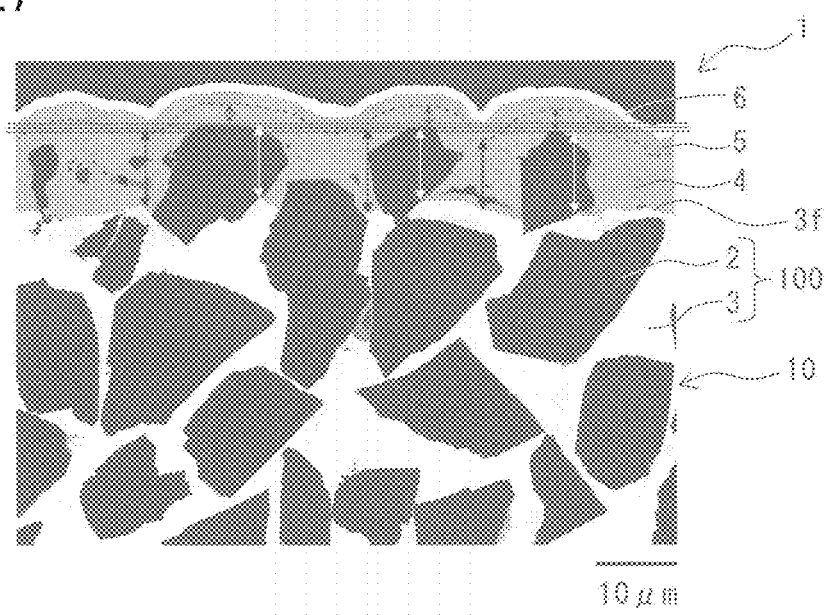
FIG. 7 is an explanatory diagram illustrating a method of measuring a thickness of a coating layer with reference to an SEM image in FIG. 6.

FIG. 6 is a microphotograph of a cross section of composite member 1 (a plated substrate of sample No. 1) produced in test example 1 described later. The cross section was obtained by cutting composite member 1 along a plane in parallel with the thickness direction. This microphotograph was taken by SEM. FIG. 7 is an explanatory diagram of the microphotograph in FIG. 6 with reference characters and the like. In FIGS. 6 and 7, black particulate portions each show a diamond grain (a coated grain 2 in this case). Also, a light gray region located in a lower region in each of FIGS. 6 and 7 and surrounding each coated grain 2 shows a metal phase 3. In FIGS. 6 and 7, a dark gray region coating a portion of each coated grain 2 that protrudes from a surface 3f of metal phase 3 sequentially shows coating layer 4 and an additional layer 5 while a strip-shaped white region coating the upper area of this gray region shows an additional layer 6. In FIGS. 6 and 7, a black region located above the strip-shaped white region shows a background.

The above-described features about each of the regions in the microphotograph are similarly applied to FIGS. 8 to 14 described later.

[Composite Member]

Mainly referring to FIG. 1, composite member 1 of an embodiment will be described below.

<Overview>

As shown in FIG. 1, composite member 1 of the embodiment includes: substrate 10 formed of a composite material 100 containing a plurality of diamond grains 20 (coated grains 2 in this case) and metal phase 3 that bonds diamond grains 20; and coating layer 4 made of metal and coating at least a part of a surface 10f of substrate 10.

Particularly in composite member 1 of the embodiment, coating layer 4 has a smooth surface 4f with small projections and recesses. Quantitatively, coating layer 4 has a surface roughness as an arithmetic mean roughness Ra of less than 2.0 μm. Also, in composite member 1 of the embodiment, surface 10f of substrate 10 is relatively rough and has projections and recesses, but coating layer 4 is formed so as to level these projections and recesses. Thus, the thickness of coating layer 4 is partially different. Specifically, surface 10f of substrate 10 includes: surface 3f formed of metal phase 3; and a protrusion 2f made of a part of at least one diamond grain of diamond grains 20 and protruding from surface 3f of metal phase 3. In a plan view, coating layer 4 includes: a metal coating portion 43 that coats surface 3f of metal phase 3; and a grain coating portion 42 that coats protrusion 2f of diamond grain 20 and does not coat surface 3f of metal phase 3. A thickness $t_2$ of grain coating portion 42 is less than a thickness $t_3$ of metal coating portion 43. Quantitatively, the ratio of thickness $t_2$ of grain coating portion 42 to thickness $t_3$ of metal coating portion 43 (which may be hereinafter also referred to as a thickness ratio) is equal to or less than 0.80. FIG. 1 shows a boundary between metal coating portion 43 and grain coating portion 42 with a chain double-dashed line as an imaginary line.

In composite member 1 of the embodiment, coating layer 4 has smooth surface 4f, but the thickness ratio of coating layer 4 still falls within the above-mentioned specific range. Thus, coating layer 4 is less likely to peel off from substrate 10.

The following is a specific explanation for each component.

<Substrate>

As substrate 10 included in composite member 1, a substrate formed of composite material 100 mainly containing diamond grains 20 and metal phase 3 can be utilized as appropriate. Also, a known substrate or a substrate manufactured by any known manufacturing method can be utilized.

<<Diamond>>

Since a diamond representatively has high coefficient of thermal conductivity equal to or greater than 1000 W/m·K, substrate 10 including a plurality of diamond grains 20 can be utilized suitably for a heat dissipation member. The plurality of diamond grains 20 are representatively distributed in substrate 10.

The specifications such as a shape, a size, and a content of diamond grain 20 in substrate 10 can be selected as appropriate. Since the above-mentioned specifications representatively substantially maintain the specifications of diamond powder used as a source material, the specifications of diamond powder as a source material may be selected so as to achieve desired specifications.

Diamond grain 20 may have any shape without particular limitation. Diamond grains 20 each are schematically shown in a polygonal shape in FIG. 1 and FIGS. 2 to 5 described below, but may have an indefinite cross-sectional shape like coated grain 2 as illustrated in FIG. 7.

The average grain size of diamond grains 20 is equal to or greater than 10 μm and equal to or less than 100 μm, for example. The larger average grain size leads to substrate 10 with more excellent thermal conductivity. The smaller average grain size allows more excellent processability for cutting and the like of a material plate 15 (described below) (FIG. 2) in the manufacturing process, and also, readily allows smaller recesses that are caused by falling off of diamond grains 20 due to polishing and the like. This consequently readily allows smaller projections and recesses on surface 4f of coating layer 4. From the viewpoint of the above-mentioned thermal characteristics, processability and the like, the average grain size can be set to be equal to or greater than 15 μm and equal to or less than 90 μm, and specifically equal to or greater than 20 μm and equal to or less than 50 μm. In addition, when relatively fine grains and relatively coarse grains are contained, densification is facilitated in the manufacturing process, so that substrate 10 with more excellent thermal conductivity is readily achieved. The average grain size is calculated in the following manner. Specifically, a plurality of diamond grains are extracted from a prescribed measurement visual field (for example, 0.3 mm×0.2 mm) in a cross section of substrate 10. Assuming that the diameter of an equivalent area circle of each grain is defined as a grain size, the grain sizes of 20 or more grains are averaged to obtain an average grain size.

The content of diamond grains 20 is equal to or greater than 40 volume % and equal to or less than 85 volume %, for example. The larger content of diamond grains 20 can lead to substrate 10 with more excellent thermal conductivity and smaller coefficient of linear expansion. When the content of diamond grains 20 is equal to or less than 85 volume %, metal phase 3 is contained to some extent, and thereby, diamond grains 20 can be reliably bonded and also an excessively small coefficient of linear expansion can be prevented. In consideration of the above-mentioned thermal characteristics, bonding performance and the like, the above-mentioned content can be set to be equal to or greater than 45 volume % and equal to or less than 80 volume %, and specifically equal to or greater than 50 volume % and equal to or less than 75 volume %.

Diamond grains 20 in substrate 10 exist as coated grains 2 each having a coating film 21 that coats at least a part of, or preferably substantially all of, the surface of each diamond grain 20. Coating film 21 is formed of a carbide of one or more types of metals selected from Ti, Hf, and Zr, for example. Representatively in the manufacturing process, coating film 21 contributes to improvement of the wettability between molten metal that eventually forms metal phase 3 and diamond grains 20, thereby bringing diamond grains 20 and metal phase 3 into close contact with each other. Particularly in the case where the carbon component forming the above-mentioned carbide originates from diamond grain 20, diamond grains 20 and coating film 21 further come into close contact with each other. Such a close contact among diamond grains 20, coating film 21 and metal phase 3 allows formation of less-porous and dense substrate 10 (composite material 100). Such substrate 10 less undergoes thermal conductivity reduction resulting from pores, is excellent in thermal conductivity, is less likely to change the state of the interface among the above-mentioned three elements even under a hot-cold cycle, and thus, is excellent also in hot-cold cycle characteristics. Coating film 21 is preferably thin to an extent enough to achieve the above-mentioned wettability improving effect. This is because the carbide is lower in coefficient of thermal conductivity and inferior in thermal conductivity than a diamond and metal that forms metal phase 3. FIGS. 1 to 5 each show the case where substrate 10 contains coated grains 2.

<<Metal Phase>>

Examples of metal forming metal phase 3 may be silver (Ag), a silver alloy, copper (Cu), a copper alloy, aluminum (Al), an aluminium alloy, magnesium (Mg), a magnesium alloy, or the like. In this case, silver, copper, aluminum, and magnesium each are the so-called pure metal. Pure metal is generally higher in coefficient of thermal conductivity than an alloy. Thus, metal phase 3 made of pure metal can lead to substrate 10 with excellent thermal conductivity. An alloy tends to be more excellent in mechanical strength, etc., than pure metal. Thus, metal phase 3 made of an alloy readily achieves substrate 10 with excellent mechanical property. In particular, Ag, Cu and alloys thereof are higher in coefficient of thermal conductivity than Al, Mg and alloys thereof, and therefore, can lead to substrate 10 with excellent thermal conductivity. Also, Al, Mg and alloys thereof can lead to substrate 10 that is less in weight than the substrate made of Ag, Cu and alloys thereof.

In particular, metal phase 3 made of silver (Ag) or a silver alloy as a metal material can lead to substrate 10 with more excellent thermal conductivity than that made of copper (Cu) or a copper alloy.

<<Outer Shape and Size>>

The planar shape, size (a thickness, a plane area) and the like of substrate 10 can be selected as appropriate in accordance with uses and the like of composite member 1. For example, when composite member 1 is used for a heat dissipation member in a semiconductor element, substrate 10 is a plate member having a rectangular planar shape and having a plane area on which components such as a semiconductor element can be mounted. In the above-mentioned use, as substrate 10 is thinner, the heat of the semiconductor element is more readily transferred to an installation target such as a cooling device. Thus, the thickness is set to be equal to or less than 10 mm and particularly equal to or less than 5 mm, for example. The lower limit value of the thickness is not particularly limited, but may be equal to or greater than 0.3 mm for the purpose of maintaining the suitable strength of substrate 10.

<<Surface State>>

Surface 10f of substrate 10 is mainly made of diamond grains 20 and metal phase 3, and is relatively rough. Specifically, a part of at least one diamond grain of diamond grains 20 (coated grains 2 in FIG. 1) protrudes from surface 3f of metal phase 3. Surface 10f has projections and recesses including: projections each formed of protrusion 2f of diamond grain 20 that protrudes from surface 3f; and recesses each formed of surface 3f located between the plurality of protrusions 2f. The cross-sectional views in FIGS. 1 to 5 each schematically show surface 3f of metal phase 3 with a straight line, but surface 3f is actually drawn by an indefinite line including a curved line as shown in the cross-sectional photograph in FIG. 6.

It is preferable that protrusion height L2 of protrusion 2f of diamond grain 20 that protrudes from surface 3f of metal phase 3 is large to some extent, i.e., the projections and recesses on surface 10f are large to some extent, since coating layer 4 is less likely to peel off from substrate 10. This is because metal forming coating layer 4 coats the circumference of protrusion 2f, to thereby readily ensure a larger proportion of diamond grain 20 coated with coating layer 4 (which may be hereinafter also referred to as a coating ratio), with the result that coating layer 4 readily firmly holds diamond grains 20. In this case, a diamond is chemically stable, and diamond grains 20 do not substantially combine with the metal forming coating layer 4. Accordingly, it is considered that smaller protrusion height L2 leads to a smaller coating ratio, which prevents coating layer 4 from sufficiently holding diamond grains 20, so that coating layer 4 is more likely to peel off from substrate 10. Quantitatively, the ratio of protrusion height $L_2$ to a maximum length L of diamond grain 20 having protrusion 2f ($L_2/L$) is equal to or greater than 10% and equal to or less than 90%. The value of the ratio ($L_2/L$) is defined as an average value of the ratios ($L_2/L$) of a plurality of diamond grains 20 obtained based on maximum length L, protrusion height $L_2$ and ratio $L_2/L$ that are calculated for each diamond grain 20 as described below. In consideration of the area of contact of diamond grain 20 with metal phase 3 and the coating ratio of coating layer 4, the ratio ($L_2/L$) can be set to be equal to or greater than 30%, and specifically equal to or greater than 50% and equal to or less than 85%.

Protrusion height $L_2$ is equal to or greater than 1.0 μm, specifically equal to or greater than 4.0 μm, and more specifically equal to or greater than 8.0 μm from the viewpoint of adhesiveness. Also, protrusion height $L_2$ is equal to or less than 90 μm, specifically equal to or less than 70 μm, and more specifically equal to or less than 40 μm from the viewpoint of thermal conductivity.

Maximum length L is a maximum distance of diamond grain 20 having protrusion 2f that extends in the thickness direction in a cross section of composite member 1. Protrusion height $L_2$ is a maximum distance of protrusion 2f that extends in the thickness direction from a crossing point P between diamond grain 20 and surface 3f of metal phase 3 in the cross section.

Maximum length L and protrusion height $L_2$ are adjusted, for example, by appropriately adjusting the grain size of diamond powder, the etching condition and the like in the manufacturing process.

<Coating Layer>

Coating layer 4 coats at least a part of surface 10f of substrate 10. In this coating range, both diamond grain 20 and metal phase 3 are embedded. Such coating layer 4 allows mechanical protection of substrate 10, protection of substrate 10 from its surrounding environment, improvement in external appearance of substrate 10, and the like. Furthermore, coating layer 4 is made of metal, and thereby also can function as an underlying layer of a joining material such as solder. In particular, coating layer 4 included in composite member 1 of the embodiment has a partially different thickness as described above, but has smooth surface 4*f*. Thus, coating layer 4 also functions to readily form a uniformly thick joining material such as solder, grease and the like.

<<Coating Range>>

As a representative embodiment, coating layer 4 is formed on the substantially entire surface of substrate 10. This embodiment is preferable since it is excellent in corrosion resistance. As an additional embodiment, coating layer 4 is formed on at least a part of one surface of the front and back surfaces of substrate 10, and coating layer 4 is formed on at least a part of each of the front and back surfaces of substrate 10.

<<Structure and Manufacturing Method>>

Coating layer 4 representatively has a single-layer structure made of a single type of metal. By using different types of plating solutions and the like for plating in two steps as described below, metal coating portion 43 can be formed to have a multilayer structure made of different types of metals. Coating layer 4 is formed using electroless plating or vacuum deposition. Since substrate 10 contains non-conductive diamond grains 20, a method allowing film formation without requiring electricity conduction to substrate 10 is readily applicable. In particular, electroless plating allows excellent flowing of the plating solution even to recesses on the surface of the material subjected to plating. Thus, as compared with vacuum deposition, a plating layer is readily formed to have a uniform thickness in any portion on the surface of the above-mentioned source material, and the plating thickness is readily controlled. Furthermore, utilization of electroless plating can reduce the manufacturing cost as compared with vacuum deposition.

<<Composition>>

The metal forming coating layer 4 can be selected as appropriate, and for example, may be nickel (Ni), a nickel alloy, copper, a copper alloy, gold (Au), a gold alloy, silver, a silver alloy, and the like. In this case, nickel, copper, gold, and silver each are the so-called pure metal. Ni, Cu, and alloys thereof are lighter than Au, Ag, and alloys thereof, and thus, readily formed as lightweight composite member 1. Au, Ag, and alloys thereof are higher in coefficient of thermal conductivity than Ni, Cu, and alloys thereof, and thus, readily formed as composite member 1 with excellent thermal conductivity.

An example of the nickel alloy forming coating layer 4 is a nickel alloy containing phosphorus (P) (which may be hereinafter also referred to as an Ni—P alloy). Since the metal layer made of an Ni—P alloy can be formed by electroless plating, a plating layer having a uniform thickness is readily formed in the manufacturing process as described above, the plating thickness is readily controlled, and the manufacturing cost can be reduced as compared with vacuum deposition. Another example of the nickel alloy is an alloy containing boron (B) (an Ni—B alloy) and the like.

<<Surface Roughness>>

Coating layer 4 has smooth surface 4*f*. Quantitatively, coating layer 4 has a surface roughness as arithmetic mean roughness Ra of less than 2.0 μm. Since coating layer 4 has small surface roughness Ra, the above-mentioned joining material and the like each are readily formed to have a uniform thickness on coating layer 4, and formation of a locally thick portion in the joining material and the like can be reduced. As surface roughness Ra is smaller, the joining material and the like each are more readily formed to have a uniform thickness. Thus, surface roughness Ra is preferably equal to or less than 1.8 μm, more preferably equal to or less than 1.5 μm, and further more preferably equal to or less than 1.0 μm, and still more preferably equal to or less than 0.8 μm. The lower limit value of surface roughness Ra is theoretically 0 μm.

Surface roughness Ra is adjusted by protrusion height $L_2$ of diamond grain 20, protrusion height $L_{26}$ (FIG. 4) obtained after first electroless plating, and the like, for example, when coating layer 4 is formed using a method of manufacturing a composite member (described later).

<<Thickness Ratio>>

In a plan view, coating layer 4 includes: metal coating portion 43 that coats surface 3*f* of metal phase 3; and grain coating portion 42 that coats protrusion 2*f* of diamond grain 20 but does not coat surface 3*f* of metal phase 3. In this case, in a perspective plan view of composite member 1 as seen from coating layer 4, substrate 10 may include, in addition to the portion including only surface 3*f* of metal phase 3, a portion where a part of protrusion 2*f* of diamond grain 20 is superimposed on surface 3*f* of metal phase 3 (a portion where diamond grain 20 overhangs surface 30. In this case, metal coating portion 43 coats both a part of protrusion 2*f* and surface 3*f* of metal phase 3. In other words, metal coating portion 43 includes a portion that substantially coats only surface 3*f* of metal phase 3 and a portion that coats the above-mentioned superimposed portion. In a view of the cross section of composite member 1 as shown in FIG. 1, on surface 3*f* of metal phase 3, the portion located between two dotted lines extending in the up-down direction of coating layer 4 in FIG. 1 corresponds to a portion that coats only the above-mentioned surface 3*f*, and a portion located between a dotted line and an adjacent chain double-dashed line corresponds to a portion that coats the above-mentioned superimposed portion (also see FIG. 7). The dotted line is a straight line that extends in parallel with the thickness direction of composite member 1 (the up-down direction in FIG. 1) and that passes through a point of contact with protrusion 2*f* in coating layer 4. The chain double-dashed line is a straight line that extends in parallel with the thickness direction and that passes through crossing point P among surface 3*f* of metal phase 3, diamond grain 20 and coating layer 4. Grain coating portion 42 is a portion that coats only protrusion 2*f* of diamond grain 20. In a view of the above-mentioned cross section as shown in FIG. 1, grain coating portion 42 is a portion that coats the portion located between two chain double-dashed lines extending adjacent to each other in protrusion 2*f*. Specifically, grain coating portion 42 is a portion located between crossing points P and P in the portion of coating layer 4 that coats the upper area of protrusion 2*f*.

Particularly in composite member 1 of the embodiment, thickness $t_2$ of grain coating portion 42 is less than thickness $t_3$ of metal coating portion 43, and the thickness ratio ($t_2/t_3$) is equal to or less than 0.80. When the thickness ratio is equal to or less than 0.80, even metal coating portion 43 having relatively thin thickness $t_3$ can ensure a higher coating ratio of coating layer 4 over diamond grain 20, so that the adhesion force between substrate 10 and coating layer 4 is enhanced. Less thickness $t_3$ of metal coating portion 43 leads to more enhanced heat conduction to metal phase 3, thereby allowing excellent thermal conductivity. In consideration of the thermal conductivity, the thickness ratio ($t_2/t_3$) can be set to be equal to or less than 0.75, and specifically equal to or less than 0.70, and more specifically equal to or less than 0.65.

When the thickness ratio ($t_2/t_3$) is greater than zero, protrusion 2f of diamond grain 20 is coated with coating layer 4 (grain coating portion 42), thereby improving the coating ratio of coating layer 4. Particularly when the thickness ratio ($t_2/t_3$) is equal to or greater than 0.01, a higher coating ratio can be ensured, thickness $t_3$ of metal coating portion 43 is not excessively large, and thus, heat conduction to metal phase 3 is less likely to be blocked. In consideration of the above-mentioned adhesiveness and the like, the thickness ratio ($t_2/t_3$) can be set to be equal to or greater than 0.05, specifically equal to or greater than 0.10, and more specifically equal to or greater than 0.30.

The thickness of coating layer 4 on one surface of substrate 10 can be selected as appropriate. As the thickness is smaller, the thermal conductivity is more readily enhanced. As the thickness is larger, surface roughness Ra is more readily reduced and the function of protecting substrate 10 is more readily improved. The thickness also depends on protrusion height $L_2$ and the like of diamond grain 20. For example, thickness $t_3$ of metal coating portion 43 is approximately equal to or greater than 5 μm and equal to or less than 10 μm, and thickness $t_2$ of the grain coating portion is approximately equal to or greater than 1 μm and equal to or less than 5 μm.

The thickness ratio, thicknesses $t_2$, $t_3$ and the like are adjusted, for example, by appropriately adjusting the grain size of diamond powder, the etching condition, the film formation condition and the like in the manufacturing process.

<<Additional Layer>>

Figure 3:
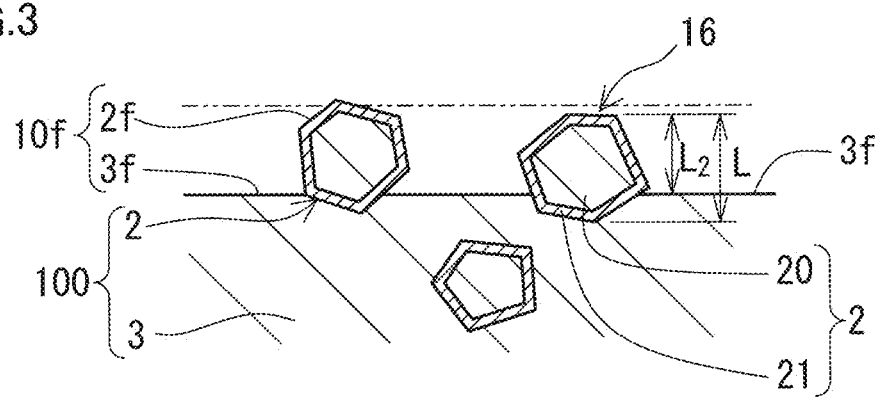
FIG. 3 is another step explanatory diagram illustrating the method of manufacturing a composite member of the embodiment.

An additional layer made of metal can be separately formed on coating layer 4. FIG. 7 shows the case where two additional layers 5 and 6 are formed on coating layer 4. In FIG. 7, a strip-shaped white region correspond to additional layer 6, and a dotted line shows the boundary between coating layer 4 and additional layer 5. As metal forming the additional layers, metals listed in the above paragraph of <<Composition>> can be selected as appropriate. The thickness of each layer is approximately equal to or greater than 0.1 μm and equal to or less than 5 μm, for example. When a plurality of additional layers are provided, these additional layers can be formed of different types of metals or can be formed of the same type of metal. For example, when an Ni layer and an Au layer are included as additional layers, the wettability to solder is further improved. The surface property of the additional layer follows the surface property of coating layer 4 located therebelow as shown in FIG. 3. Surface roughness Ra of the additional layer may be a value substantially equal to surface roughness Ra of coating layer 4, i.e., may be less than 2.0 μm. Thus, surface roughness Ra of the additional layer can be regarded as surface roughness Ra of coating layer 4.

<Manufacturing Method>

Composite member 1 of the embodiment is manufactured, for example, by a method of manufacturing a composite member in the following embodiment in which electroless plating is performed in two steps.

<Main Effects>

Composite member 1 of the embodiment is excellent in thermal conductivity since it is mainly formed of substrate 10 containing diamond grains 20 having high coefficient of thermal conductivity. From this point of view, composite member 1 can be utilized suitably for various types of heat dissipation members. In particular, the coefficient of linear expansion of substrate 10 is close to the coefficients of linear expansion of the semiconductor element and components provided therearound since substrate 10 is formed of composite material 100 containing diamond grains 20 and metal phase 3. Furthermore, composite member 1 is provided with coating layer 4 and thereby excellent also in wettability to a joining material such as solder, and this joining material allows excellent joining of the semiconductor element onto substrate 10 (coating layer 4). From these points of view, composite member 1 can be utilized suitably for a heat dissipation member in the semiconductor element.

In particular, composite member 1 of the embodiment includes coating layer 4 having a smooth surface with extremely small surface roughness Ra. Thus, when composite member 1 is used, for example, for a heat dissipation member in the semiconductor element, joining materials such as solder, grease and the like each are readily formed to have a uniform thickness along smooth surface 4f. Such composite member 1 of the embodiment is excellent in thermal conductivity since it suppresses a local increase in thermal resistance resulting from a thick portion locally formed in the joining material or grease.

Also, in composite member 1 of the embodiment, coating layer 4 satisfies the above-mentioned thickness ratio, and thickness $t_2$ of grain coating portion 42 that substantially coats only diamond grains 20 is thinner than thickness $t_3$ of metal coating portion 43 that coats surface 3f of metal phase 3. Thus, when composite member 1 is used, for example, for a heat dissipation member in the semiconductor element, the distance between protrusion 2f of diamond grain 20 and the semiconductor element or an installation target can be shortened, so that the heat of the semiconductor element is efficiently transferred to the installation target. Also based on this, composite member 1 of the embodiment is excellent in thermal conductivity.

Furthermore, in composite member 1 of the embodiment, coating layer 4 is formed so as to embed protrusions 2f of diamond grains 20 therein and so as to surround each diamond grain 20. Thus, a higher coating ratio of coating layer 4 over diamond grain 20 can be ensured, and the adhesion force between diamond grains 20 and coating layer 4 is enhanced by the so-called anchor effect. Accordingly, coating layer 4 is less likely to peel off from substrate 10. When composite member 1 is used, for example, for a heat dissipation member in the semiconductor element, coating layer 4 is less likely to peel off from substrate 10 even under thermal histories such as soldering in the manufacturing process and a hot-cold cycle during use. Such composite member 1 of the embodiment allows formation of a heat dissipation member that is excellent in thermal conductivity for a long period of time.

In addition, examples of the semiconductor device including composite member 1 of the embodiment as a heat dissipation member may be various types of electronic devices, particularly, a high-frequency power device (for example, a laterally diffused metal oxide semiconductor), a semiconductor laser device, a light-emitting diode device, and also, a central processing unit (CPU), a graphics processing unit (GPU), a high electron mobility transistor (HEMT), a chip set, a memory chip, and the like in various types of computers. In particular, composite member 1 is suitable for a heat dissipation member in a semiconductor element such as a SiC device and a GaN device that generates considerable heat.

[Method of Manufacturing Composite Member]

Mainly referring to FIGS. 2 to 5, a method of manufacturing a composite member of an embodiment will be hereinafter described.

<Overview>

The method of manufacturing a composite member of the embodiment includes a surface roughening step, a first plating step, and a second plating step as described below.

(Surface Roughening Step) The step includes etching the surface of material plate 15 (FIG. 2) formed of composite material 100 containing a plurality of diamond grains 20 (coated grains 2 in this case) and metal phase 3 that bonds diamond grains 20, to produce a rough surface plate 16 in which a part of at least one diamond grain of diamond grains 20 protrudes from surface 3f of metal phase 3 (FIG. 3).

Figure 4:
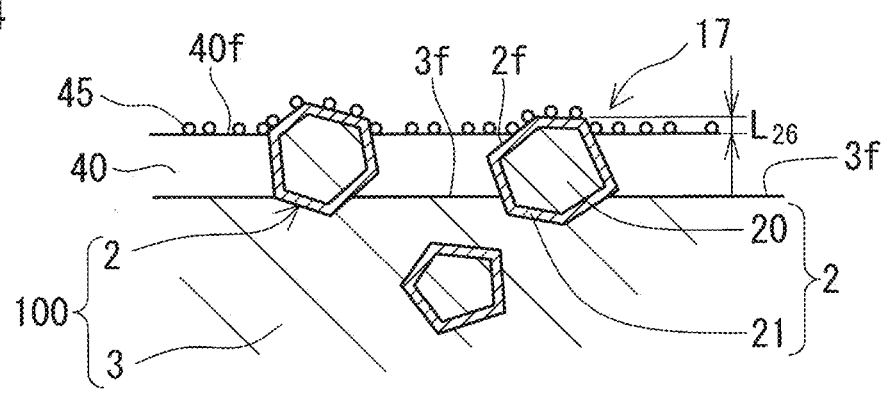
FIG. 4 is another step explanatory diagram illustrating the method of manufacturing a composite member of the embodiment.

(First Plating Step) The step includes subjecting rough surface plate 16 to first electroless plating to produce a partial coating plate 17 in which a first plating layer 40 is formed on surface 3f of metal phase 3 while exposing a part of at least one diamond grain of diamond grains 20 existing on the surface of material plate 15 (FIG. 4).

Figure 5:
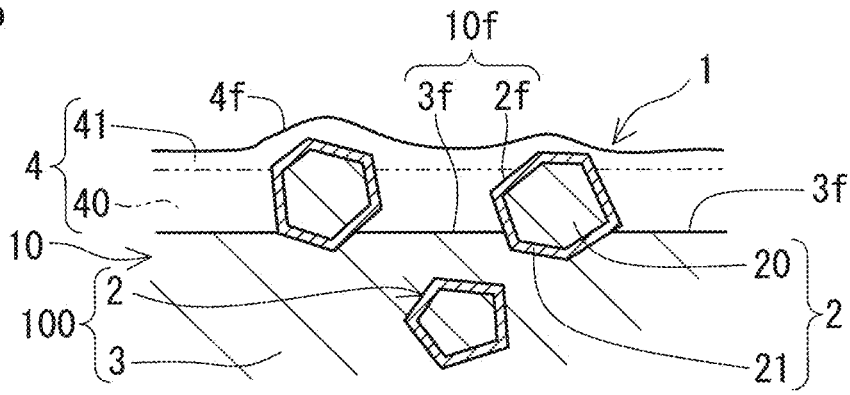
FIG. 5 is another step explanatory diagram illustrating the method of manufacturing a composite member of the embodiment.

(Second Plating Step) The step includes subjecting partial coating plate 17 to second electroless plating to form a second plating layer 41 that coats a surface 40f of first plating layer 40 and a portion of at least one diamond grain of diamond grains 20 that is exposed from surface 40f of first plating layer 40 (FIG. 5).

Through the above-mentioned steps, composite member 1 can be manufactured, in which surface 10f of substrate 10 formed of composite material 100 is coated with coating layer 4 including first plating layer 40 and second plating layer 41. According to the method of manufacturing a composite member of the embodiment, simply stated, the surface of material plate 15 formed of composite material 100 is roughened by etching, projections and recesses formed of protrusion of a part of at least one diamond grain of diamond grains 20 are leveled to some extent by first electroless plating, and then, each diamond grain 20 is completely embedded by second electroless plating. In this way, coating layer 4 having a smooth surface 4f is formed. The following is an explanation about each step.

<Preparing Step>

First, material plate 15 formed of composite material 100 is prepared. Material plate 15 can be manufactured using source materials including diamond powder and metal powder, a metal lump or the like that forms metal phase 3 by referring to a known manufacturing method, for example, an infiltration method and the like as disclosed in PTLs 1 and 2. For forming a coated grain having coating film 21, source materials (compound powder and the like) for coating film 21 as disclosed in PTLs 1 and 2 are preferably used.

The surface of material plate 15 can be polished. Thereby, the surface of material plate 15 is readily flattened. Also, in the next surface roughening step, metal phase 3 is removed readily to a uniform depth (etching depth). Consequently, coating layer 4 having smooth surface 4f is readily formed. After polishing, the surface of material plate 15 includes a polished surface of diamond grain 20 and a polished surface of metal phase 3. After polishing, the plurality of diamond grains 20 may include diamond grains 20 having protrusions 2f each having a flat surface (a polished surface) (see FIGS. 6 and 7).

<Surface Roughening Step>

In this step, material plate 15 is etched to partially remove metal phase 3 and thereby cause a part of diamond grain 20 to protrude. In other words, the polished surface of metal phase 3 is dug down to form new surface 3f. The etching condition can be selected as appropriate. Depending on the grain size and the like of diamond grain 20, the etching condition may be adjusted such that protrusion height $L_2$ attains 10% or more and 90% or less of maximum length L of diamond grain 20. In this case, protrusion height $L_2$ and maximum length L in the manufacturing process are substantially maintained in composite member 1, thereby achieving composite member 1 in which the ratio of protrusion height $L_2$ to maximum length L ($L_2$/L) is equal to or greater than 10% and equal to or less than 90%. Acids or alkalis not substantially reacting with a diamond and allowing removal of metal phase 3 can be suitably used for etching. This step allows formation of rough surface plate 16 having projections and recesses including: projections each formed of protrusion 2f of diamond grain 20; and recesses each formed of surface 3f of metal phase 3 and existing between diamond grains 20, as shown in FIG. 3.

<First Plating Step>

In this step, first electroless plating is performed in order to level the above-mentioned projections and recesses to some extent on rough surface plate 16. In this case, when electroless plating is performed once so as to simultaneously coat both protrusions 2f and metal phase 3, a plating layer is representatively isotropically formed by electroless plating, with the result that the plating layer also has a surface having projections and recesses along the projections and recesses of rough surface plate 16. In other words, a plating layer having a large surface roughness is formed. Specifically, when there are a large number of diamond grains each having a large protrusion height $L_2$ as described above, a plating layer having a large surface roughness is more likely to be formed. Thus, in the method of manufacturing a composite member of the embodiment, electroless plating is performed twice. In this step, first electroless plating is performed so as to mainly fill the recesses formed in metal phase 3 between diamond grains 20 while exposing a part of at least one diamond grain of diamond grains 20, particularly a part of each diamond grain 20 that protrudes greatly as described above. For this purpose, first electroless plating is performed using a catalyst that acts to substantially activate only metal phase 3. Through this step, partial coating plate 17 is formed, in which the space above surface 3f of metal phase 3 between diamond grains 20 is filled with first plating layer 40, and a part of at least one diamond grain of diamond grains 20 is exposed from surface 40f of first plating layer 40, as shown in FIG. 4. When a relatively less protruding diamond grain 20 exist between relatively more protruding diamond grains 20, this relatively less protruding diamond grain 20 is coated with first plating layer 40 together with metal phase 3 (see a diamond grain located center among the diamond grains each having a protrusion in FIG. 6).

Although a part of diamond grain 20 may protrude from surface 40f of first plating layer 40, this protrusion height $L_{26}$ is less than protrusion height $L_2$ in rough surface plate 16, which is achieved by adjusting the first electroless plating condition in accordance with protrusion height $L_2$ and the like. It is particularly preferable to adjust the first electroless plating condition such that protrusion height $L_{26}$ of partial coating plate 17 attains zero as practicable as possible. In this case, only the uppermost surface of diamond grain 20 is exposed from surface 40f of first plating layer 40. For example, the portion of diamond grain 20 exposed from surface 40f of first plating layer 40 corresponds to the above-mentioned polished surface. Thus, by adjusting the first electroless plating condition such that the polished surface is substantially flush with surface 40f, the surface of partial coating plate 17 is readily smoothened.

Along this smooth surface, surface 4f of second plating layer 41 (described later) is also readily smoothened, and thus, the surface roughness of coating layer 4 is readily reduced (for example, Ra of less than 2.0 μm).

In addition, as pre-processing of the first electroless plating, degreasing, desmut (surface adjustment), catalyst application (see the above) and the like may be performed. Washing and drying can be performed between each processing as required. Commercially-available products may be applicable as a chemical agent used for each processing.

<Second Plating Step>

In this step, second electroless plating is performed for coating the portion of each diamond grain 20 exposed from partial coating plate 17 and surface 40f of first plating layer 40. For this purpose, second electroless plating is performed using a catalyst 45 (FIG. 4) that acts to activate both diamond grains 20 and the metal forming first plating layer 40. This step leads to formation of composite member 1 in which surface 3f of metal phase 3 in substrate 10 and protrusions 2f of diamond grains 20 protruding from surface 3f of metal phase 3 are coated with coating layer 4 including first plating layer 40 and second plating layer 41, as shown in FIG. 5. Representatively, composite member 1 is formed that includes coating layer 4 having smooth surface 4f with surface roughness Ra of less than 2.0 μm. According to the method of manufacturing a composite member of the embodiment, for example, as compared with the method of forming a thick plating layer which is then polished to form a smooth surface, the number of steps can be reduced and the time required for plating can be shortened, thereby allowing excellent manufacturability. Furthermore, without discarding of plating materials caused by polishing, the manufacturing cost can also be reduced.

<Other Steps>

The second plating step can be followed by heat treatment. Heat treatment allows close contact between plating layers 40 and 41, thereby enhancing the mechanical strength of coating layer 4. After heat treatment, the boundary between plating layers 40 and 41 (shown by a chain double-dashed line as an imaginary line in FIG. 5) becomes substantially invisible. The heat treatment condition can be selected as appropriate in a range in which the adhesiveness between plating layers 40 and 41 is enhanced while substrate 10 is not heat-damaged. Depending on the composition and the like of plating, for example, the heating temperature is approximately equal to or greater than 200° C. and equal to or less than 850° C., and the retention time is approximately equal to or greater than 1 minute and equal to or less than 240 minutes. When the heat treatment is performed in an atmosphere such as a vacuum atmosphere, an inert atmosphere (for example, nitrogen gas, argon gas), a reducing atmosphere (for example, hydrogen gas, mixed gas of hydrogen gas and inert gas, or carbon monoxide gas) or the like, oxidation of composite member 1 is readily prevented.

Test Example 1

The material plate formed of a composite material containing diamond grains and a silver phase was subjected to electroless plating on various conditions, to produce a composite member including a substrate formed of the composite material and a coating layer formed of an electroless plating layer. Then, the surface state of the coating layer was examined.

The material plate produced based on PTL 2 was prepared. This material plate is a flat plate material formed in a square shape having each side length of 50 mm and a thickness of 1.4 mm. The material plate contains diamond grains with a content of about 60 volume % and a silver phase with a content of about 40 volume %. The average grain size of the diamond grains is 20 μm. In this case, the surface of the prepared material plate was polished.

The polished material plate was etched and thereafter subjected to electroless plating to thereby form a plated substrate that includes a plating layer made of an Ni—P alloy on the entire surface of a substrate formed of a composite material that contains diamond grains (coated grains each having a coating film made of TiC in this case) and a silver phase.

<Sample No. 1>

Sample No. 1 was obtained by performing etching and thereafter electroless plating in two steps.

The etching condition was adjusted such that a large number of diamond grains among the diamond grains near the surface of the material plate each have protrusion height $L_2$ from the surface of the silver phase to attain 10% or more and 90% or less of maximum length L of a diamond grain, with the result that a part of at least one diamond grain of the diamond grains protrudes from the surface of the silver phase. Specifically, etching was performed at 30° C. for 2 minutes using an aqueous solution prepared as an etching solution containing potassium cyanide with a concentration of 50 g/L. After etching, protrusion height $L_2$ of each diamond grain in the material plate is 6 μm.

Then, a substitutional Pd catalyst solution was prepared as a processing solution for catalyst application to first electroless plating.

After the above-mentioned etching, the material plate was subjected sequentially to degreasing, desmut, and catalyst application using the processing solution, and thereafter subjected to first electroless plating. The first electroless plating condition was adjusted such that protrusion height $L_{26}$ of at least one diamond grain of the diamond grains protruding from the surface of this plating layer was as sufficiently small as 0.3 or less of protrusion height $L_2$ before plating. Specifically, first electroless plating was performed at a bath temperature of 85° C. for a plating time of 30 minutes using an electroless Ni—P plating solution prepared as a plating solution containing 20 g/L of nickel sulfate, 24 g/L of sodium hypophosphite, 27 g/L of lactic acid, and 2.0 g/L of propionic acid.

By first electroless plating, the first plating layer made of an Ni—P alloy is formed on the surface of the silver phase existing between the diamond grains in the material plate. The surface of the silver phase is substantially embedded in this first plating layer. The first plating layer has a thickness of 5.5 μm.

Then, an Sn—Pd colloid type catalyst solution was prepared as a processing solution for catalyst application to second electroless plating.

The partial coating plate including the first plating layer was subjected sequentially to catalyst application using the processing solution and catalytic activation, and then, subjected to second electroless plating. The second electroless plating condition was adjusted so as to apply coating on the surface of the first plating layer and a portion of at least one diamond grain of the diamond grains that is exposed from the surface of the first plating layer. Specifically, second electroless plating was performed at a bath temperature of 85° C. for a plating time of 16 minutes using the same electroless Ni—P plating solution as that used for first electroless plating.

By second electroless plating, the surface of the substrate formed of the composite material is embedded in the first plating layer and the second plating layer, each of which is made of an Ni—P alloy. The second plating layer has a thickness of 3.0 μm.

The second electroless plating was further followed by heat treatment. The heat treatment condition was set at a heating temperature of 800° C. for a heating time of 60 minutes in a reducing atmosphere containing 100% hydrogen.

In this case, after the heat treatment, electroplating was further performed to form a pure nickel layer and a pure gold layer sequentially on the Ni—P alloy layer. Thus, the plated substrate of sample No. 1 includes: a coating layer made of an Ni—P alloy; and two additional layers including a pure nickel layer and a pure gold layer, which are sequentially formed on the substrate formed of the composite material.

<Sample No. 2>

Sample No. 2 was obtained by performing etching and thereafter electroless plating in two steps.

A specific method of producing sample No. 2 was the same as the method of producing sample No. 1 except that the time (length) of etching was 1 minute and 30 seconds.

<Sample No. 3>

Sample No. 3 was obtained by performing etching and thereafter electroless plating in two steps.

A specific method of producing sample No. 3 was the same as the method of producing sample No. 1 except that the time (length) of etching was 1 minute.

<Sample No. 4>

Sample No. 4 was obtained by performing etching and thereafter electroless plating in two steps.

A specific method of producing sample No. 4 was the same as the method of producing sample No. 1 except that the time (length) of etching was 30 seconds.

<Sample No. 101>

Sample No. 101 was obtained by performing etching and thereafter electroless plating in the first step but not performing electroless plating in the second step.

This sample No. 101 was etched on the same condition as that of sample No. 1 and then subjected to catalyst application using the following processing solution, and further subjected to catalytic activation and electroless plating. Further, two additional layers were formed on the electroless plating layer.

Then, using an Sn—Pd colloid type catalyst solution as a processing solution for catalyst application to sample No. 101, electroless plating was performed on the same condition as that in the second electroless plating of sample No. 1 to thereby form an electroless plating layer having a thickness of 3.0 μm.

<Sample No. 102>

Sample No. 102 was obtained by performing etching at an etching depth shallower than those in samples No. 1 and No. 101 and thereafter performing electroless plating in the first step but not performing electroless plating in the second step. In this case, electroless plating was performed on the same condition as that of sample No. 101 except that a different etching condition was used. Sample No. 102 has not been subjected to electroplating and includes only an electroless plating layer.

The etching condition was adjusted such that a large number of diamond grains among the diamond grains near the surface of the material plate each have protrusion height $L_2$ from the surface of the silver phase to be 0.2 or less of maximum length L of the diamond grain. Specifically, etching was performed at 30° C. for 10 seconds using an aqueous solution prepared as an etching solution containing potassium cyanide with a concentration of 50 g/L. Protrusion height $L_2$ of each diamond grain in the material plate after etching is 0.5

For the plated substrates of samples No. 1 to No. 4, No. 101, and No. 102, the surface roughness of each coating layer was measured. In this case, arithmetic mean roughness Ra (μm) was measured using a 50×-magnification objective lens of a laser microscope VK-X100 available from KEYENCE CORPORATION. The results are shown in Table 1. For samples No. 1 to No. 4 and No. 101, surface roughness Ra of the Ni—P alloy layer was measured before formation of a nickel layer and a gold layer. For sample No. 102, surface roughness Ra of the electroless plating layer was measured.

Each of the plated substrates of samples No. 1 to No. 4, No. 101, and No. 102 was cut along the plane in parallel with the thickness direction of the substrate (in this case, the direction in which the substrate and the plating layer are stacked). The resultant cross section was observed by SEM. In this case, the cross section was taken by a crossing section polisher (CP).

Figure 8:
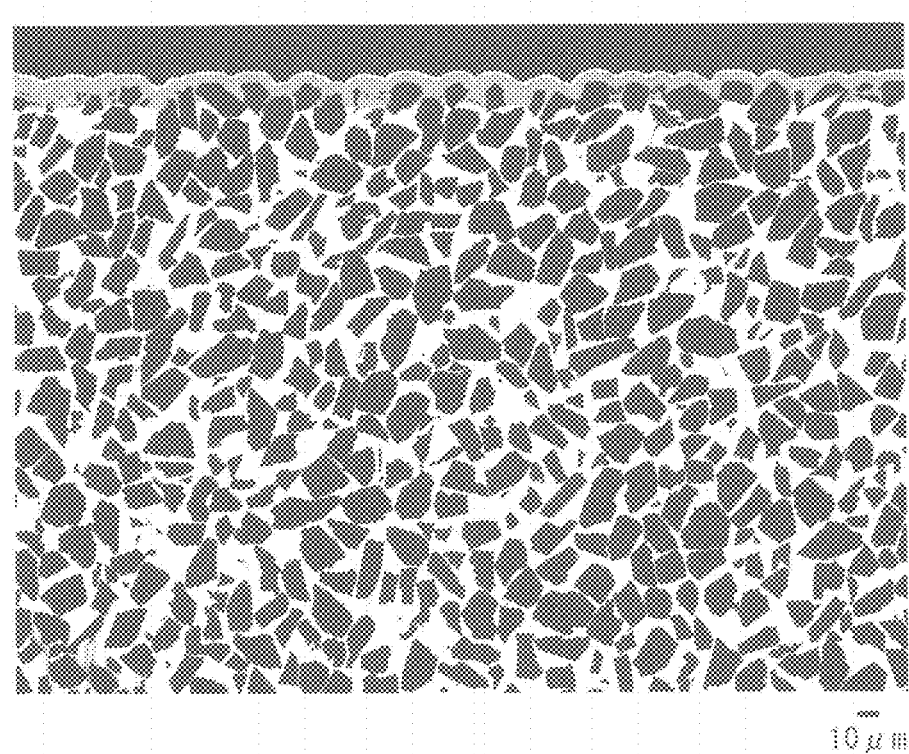
FIG. 8 is a microphotograph of a cross section of the composite member of sample No. 1 produced in test example 1 and taken by SEM.
Figure 9:
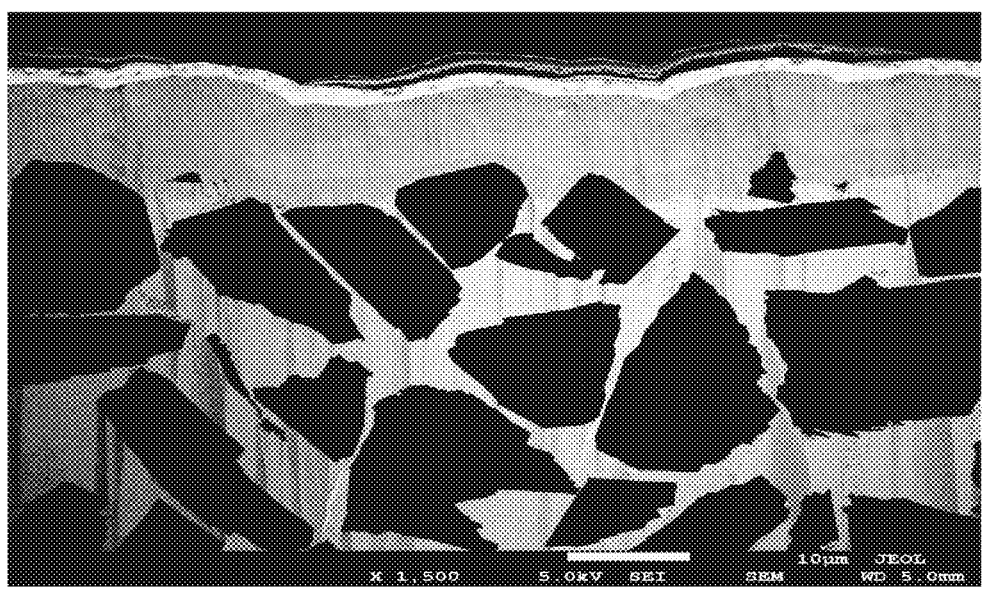
FIG. 9 is a microphotograph of a cross section of a composite member of sample No. 2 produced in test example 1 and taken by SEM.
Figure 10:
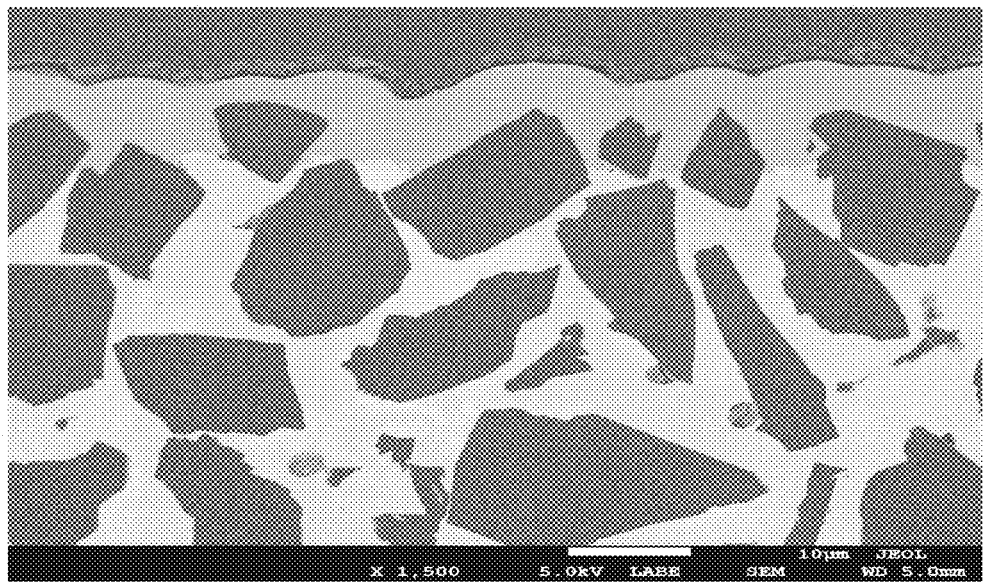
FIG. 10 is a microphotograph of a cross section of a composite member of sample No. 3 produced in test example 1 and taken by SEM.
Figure 11:
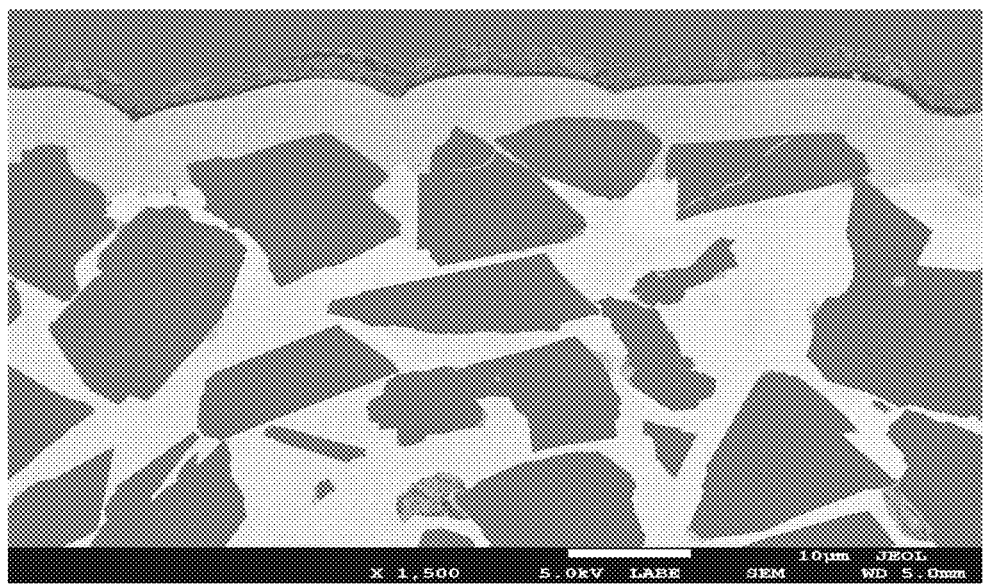
FIG. 11 is a microphotograph of a cross section of a composite member of sample No. 4 produced in test example 1 and taken by SEM.
Figure 12:
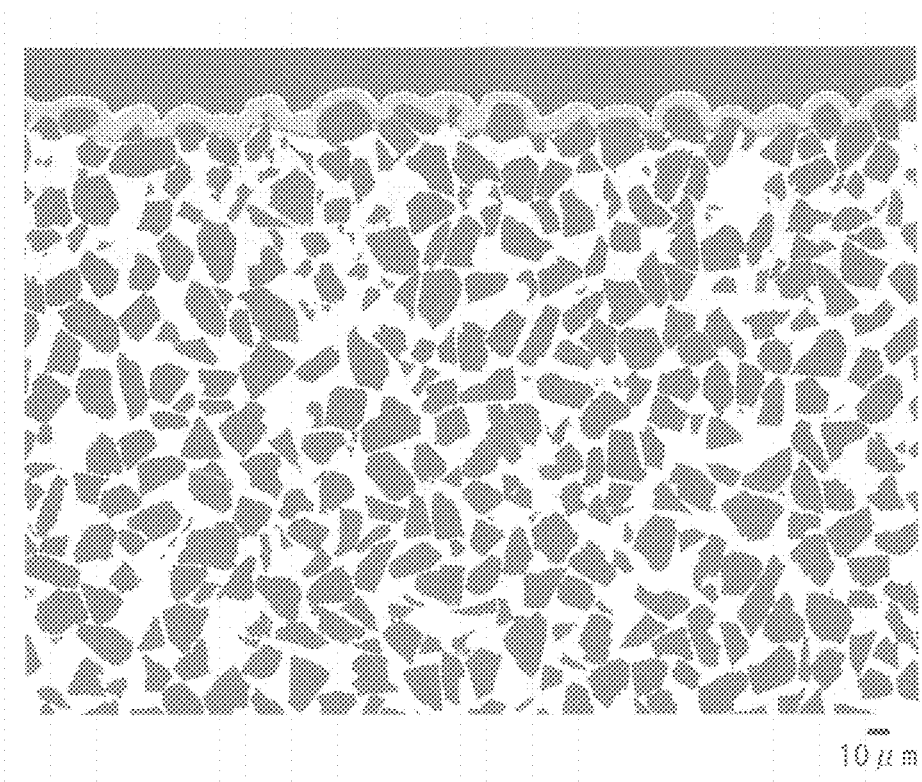
FIG. 12 is a microphotograph of a cross section of a composite member of sample No. 101 produced in test example 1 and taken by SEM.
Figure 13:
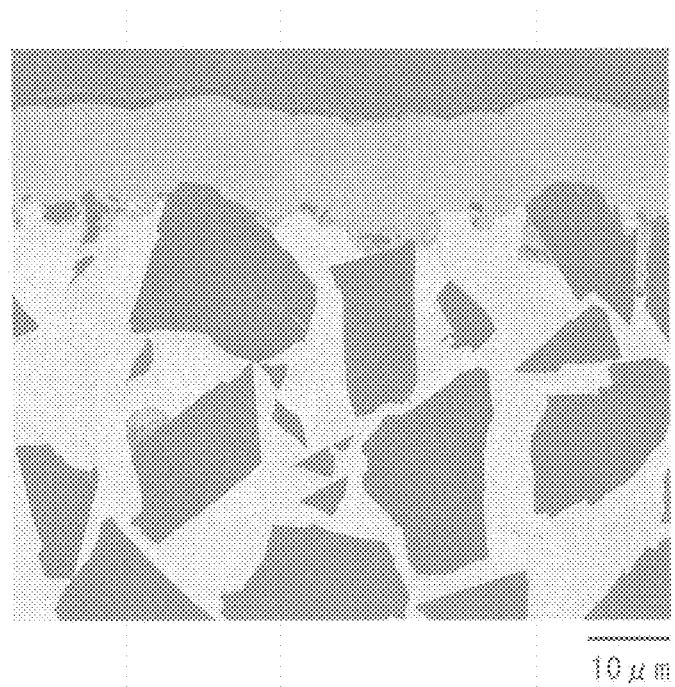
FIG. 13 is a microphotograph of a cross section of a composite member of sample No. 102 produced in test example 1 and taken by SEM.
Figure 14:
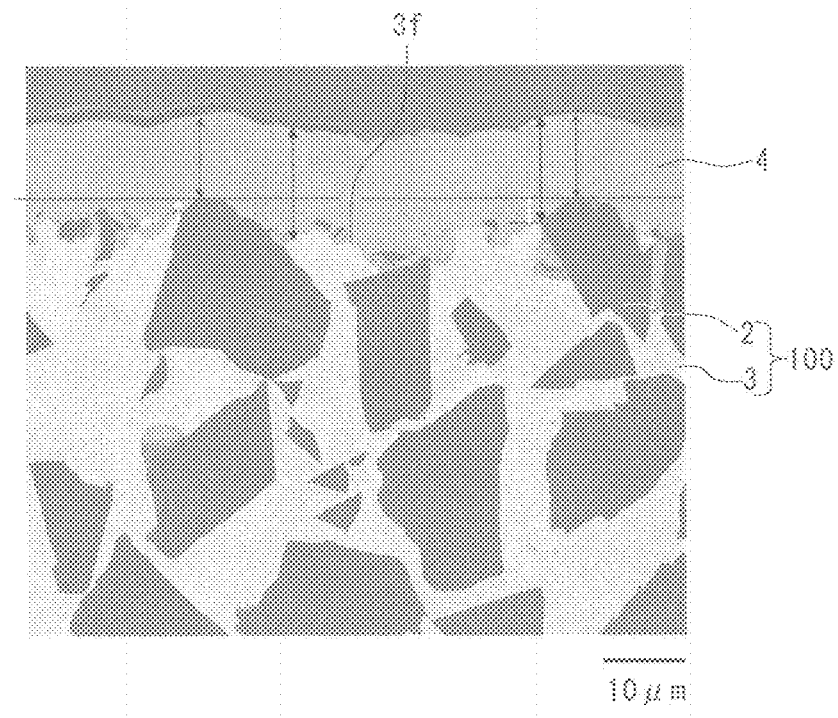
FIG. 14 is an explanatory diagram illustrating a method of measuring a thickness of a coating layer with reference to an SEM image in FIG. 13.

FIGS. 6 to 8 each are an SEM photograph of the cross section of the plated substrate of sample No. 1. FIGS. 6 and 7 each show a partial enlarged photograph of FIG. 8. FIG. 9 is an SEM photograph of the cross section of the plated substrate of sample No. 2. FIG. 10 is an SEM photograph of the cross section of the plated substrate of sample No. 3. FIG. 11 is an SEM photograph of the cross section of the plated substrate of sample No. 4. FIG. 12 is an SEM photograph of the cross section of the plated substrate of sample No. 101. FIGS. 13 and 14 each are an SEM photograph of the cross section of the plated substrate of sample No. 102. Coating layer 4 in FIG. 7 includes: coating layer 4 made of an Ni—P alloy (a light gray region located below a dotted line in FIG. 7); a first additional layer 5 made of pure nickel (a region above the same dotted line); and a second additional layer 6 made of pure gold (a strip-shaped white region) that are disposed sequentially from the substrate 10 side.

The above-mentioned SEM observation image was examined to measure thickness $t_3$ of the metal coating portion that coats the silver phase in the coating layer and thickness $t_2$ of the grain coating portion that substantially coats only the diamond grains in the coating layer. Then, the thickness ratio ($t_2/t_3$) of these thicknesses was calculated. The results are shown in Table 1.

Thickness $t_2$ of the grain coating portion is calculated as follows.

For sample No. 1, ten or more diamond grains 20 (coated grains 2 in this case; the same applies to this paragraph and the following paragraph) are extracted, each of which has a portion protruding from surface $3f$ of metal phase 3 in the SEM observation image, as shown in FIG. 7 Then, grain coating portion 42 coating only these ten or more extracted diamond grains 20 is extracted from coating layer 4. Thickness $t_2$ of the extracted grain coating portion 42 is then measured. In the cross section, grain coating portion 42 corresponds to a region located in coating layer 4 between two straight lines (see chain double-dashed lines in FIG. 1) that extend in parallel with the thickness direction and pass through a crossing point of diamond grain 20 with surface $3f$ of metal phase 3. The thickness of this region is measured to obtain a minimum value of the thickness. The thickness in this case corresponds to a distance between diamond grain 20 and coating layer 4 in the thickness direction (in the up-down direction in FIGS. 1 and 7). Then, ten or more thickness minimum values are obtained and averaged to obtain an average value, which is defined as thickness $t_2$. Each black arrow shown above each diamond grain 20 in FIG. 7 indicates the minimum value of the thickness of grain coating portion 42 (the same applies to FIG. 14). The minimum value of the thickness in this case is the shortest distance extending in the thickness direction from the surface (for example, a polished surface) of protrusion 2f of diamond grain 20 to the surface of coating layer 4. Three straight lines extending in the horizontal direction in FIG. 7 pass through the surface of each diamond grain 20 shown in FIG. 7 (the same applies to the straight line in FIG. 14).

Thickness $t_3$ of the metal coating portion is calculated as follows.

Metal coating portion 43 corresponds to a region located in coating layer 4 and coating surface 3f of metal phase 3 that exists between adjacent diamond grains 20 each having a portion protruding from surface 3f of metal phase 3 as mentioned above. The thickness of this region is measured to obtain the minimum value thereof. Then, ten or more thickness minimum values are obtained and averaged to obtain an average value, which is defined as thickness $t_3$. In this case, based on the point located at 50% of the shortest distance between the above-mentioned adjacent diamond grains 20, metal coating portion 43 existing from each diamond grain 20 to this 50% point is defined as a measurement range in which the thickness of metal coating portion 43 is measured for each corresponding diamond grain 20. The above-mentioned region coating surface 3f of metal phase 3 includes: a region that substantially coats only surface 3f; and a region that coats a portion where surface 3f and a part of diamond grain 20 overlap with each other. Each black arrow shown on the side of each diamond grain 20 in FIG. 7 indicates the minimum value of the thickness of metal coating portion 43 (the same also applies to FIG. 14).

Also for samples No. 2 to No. 4, No. 101, and No. 102, thicknesses $t_2$ and $t_3$ were measured to calculate the thickness ratio $(t_2/t_3)$ (see FIG. 14 for sample No. 102) in the same manner as with sample No. 1.

For samples No. 1 to No. 4, No. 101, and No. 102, protrusion height $L_2$ of the diamond grain protruding from the surface of the substrate formed of a composite material and maximum length L of each grain having this protruding portion were measured to calculate the ratio of protrusion height $L_2$ to maximum length L $(L_2/L)$. The results are shown in Table 1.

The above-mentioned protrusion height $L_2$ and maximum length L are calculated using the above-mentioned SEM observation image of the cross section in the following manner. First, as described above, ten or more diamond grains 20 (coated grains 2 in this case; the same also applies to this paragraph) each having a portion protruding from surface 3f of metal phase 3 are extracted. The maximum length of each of extracted diamond grains 20 in the thickness direction of the plated substrate (in the up-down direction in FIGS. 7 and 14) is obtained and defined as maximum length L of each diamond grain 20. Also, for each of extracted diamond grains 20, the maximum distance extending in the thickness direction from crossing point P among surface 3f of metal phase 3, each diamond grain 20 and coating layer 4 (see FIG. 1) is obtained and defined as protrusion height $L_2$ of diamond grain 20. The cross-sectional observation image representatively shows two crossing points P existing in one diamond grain 20. Thus, for each diamond grain 20, the maximum distances extending in the thickness direction from these two crossing points P are obtained. The minimum value of these maximum distances is defined as protrusion height $L_2$ of diamond grain 20. FIG. 1 shows surface 3f of metal phase 3 schematically by a straight line. Thus, the maximum distances extending in the thickness direction from the respective crossing points P are the same. However, as representatively shown in FIG. 7, crossing points P in one diamond grain 20 are located at different positions in the thickness direction. Therefore, the above-mentioned maximum distances may be different. Ratio $L_2/L$ is calculated for each diamond grain 20. Then, ten or more ratios $L_2/L$ are calculated and averaged to obtain an average value, which is defined as a ratio of protrusion height $L_2$ $(L_2/L)$. Each white arrow shown on the side of each diamond grain 20 in FIGS. 7 and 14 indicates protrusion height $L_2$.

TABLE 1

| Sample No. | 1 | 2 | 3 | 4 | 101 | 102 |
|---|---|---|---|---|---|---|
| Surface Roughness Ra (μm) | 1.2 | 1.1 | 1.2 | 1.1 | 2.6 | 1.1 |
| Thickness Ratio $(t_2/t_3)$ | 0.27 | 0.36 | 0.48 | 0.76 | 0.96 | 1 |
| Ratio of Protrusion Height $L_2$ $(L_2/L)$ | 0.63 | 0.45 | 0.47 | 0.51 | 0.65 | 0.2 |
| Bulge Occurrence Ratio in Heating Treatment at 400° C. | 5% | 7% | 6% | 6% | 90% | 50% |
| Bulge Occurrence Ratio in Heating Treatment at 780° C. | 10% | 12% | 15% | 15% | 88% | 90% |

As shown in Table 1, in the plated substrates of samples No. 1 to No. 4, each diamond grain protrudes greatly from the surface of the substrate as compared with sample No. 102, whereas the coating layer has a smooth surface with small projections and recesses as compared with sample No. 101 that has relatively large protrusions to an extent similar to that of sample No. 1 (see comparison among FIGS. 8 to 12). Furthermore, in each of the plated substrates of samples No. 1 to No. 4, the thickness of the coating layer is partially different so as to correspond to the rough surface of the substrate. Also, as shown in FIGS. 8 to 11, the grain coating portion that coats only the diamond grains in the coating layer is less in thickness than the metal coating portion that coats the metal phase between the grains.

Quantitatively, in the plated substrate of sample No. 1, the ratio of protrusion height $L_2$ $(L_2/L)$ is 0.63 (63%), which is approximately the same as the ratio of sample No. 101 and which is three times or more as high as the ratio of sample No. 102. Thus, the diamond grains protrude greatly. Furthermore, in the plated substrate of sample No. 1, surface roughness Ra of the coating layer is 1.2 which is less than half of surface roughness Ra of sample No. 101 and which is approximately the same as surface roughness Ra of sample No. 102. Thus, the coating layer has a smooth surface. As shown in FIG. 8, when an additional layer exists on the coating layer, the coating layer has small surface roughness Ra, so that the additional layer also has a smooth surface. In this case, surface roughness Ra of the additional layer is approximately the same as surface roughness Ra of the coating layer (approximately 1.2 μm). Furthermore, in the plated substrate of sample No. 1, the thickness ratio $(t_2/t_3)$ in the coating layer is 0.27, which is ⅓ or less of the thickness ratio of each of samples No. 101 and No. 102. Thus, the grain coating portion is thinner than the metal coating portion.

Also Quantitatively, in the plated substrate of sample No. 2, the ratio of protrusion height $L_2$ $(L_2/L)$ is 0.45 (45%), which is twice or more as high as the ratio of sample No. 102. Thus, the diamond grains protrude greatly. Also, in the plated substrate of sample No. 2, surface roughness Ra of the coating layer is 1.1 μm, which is less than half of surface roughness Ra of sample No. 101 and which is approximately the same as surface roughness Ra of sample No. 102. Thus, the coating layer has a smooth surface. Furthermore, in the plated substrate of sample No. 2, the thickness ratio ($t_2/t_3$) in the coating layer is 0.36, which is equal to or less than half of the thickness ratio of each of samples No. 101 and No. 102. Thus, the grain coating portion is thinner than the metal coating portion.

Also Quantitatively, in the plated substrate of sample No. 3, the ratio of protrusion height $L_2$ ($L_2/L$) is 0.47 (47%), which is twice or more as high as the ratio of sample No. 102. Thus, the diamond grains protrude greatly. Also in the plated substrate of sample No. 3, surface roughness Ra of the coating layer is 1.2 μm, which is less than half of surface roughness Ra of sample No. 101 and which is approximately the same as surface roughness Ra of sample No. 102. Thus, the coating layer has a smooth surface. Also in the plated substrate of sample No. 3, the thickness ratio ($t_2/t_3$) in the coating layer is 0.48, which is equal to or less than half of the thickness ratio of each of samples No. 101 and No. 102. Thus, the grain coating portion is thinner than the metal coating portion.

Also Quantitatively, in the plated substrate of sample No. 4, the ratio of protrusion height $L_2$ ($L_2/L$) is 0.51 (51%), which is twice or more as high as the ratio of sample No. 102. Thus, the diamond grains protrude greatly. Also in the plated substrate of sample No. 4, surface roughness Ra of the coating layer is 1.1 μm, which is less than half of surface roughness Ra of sample No. 101 and which is approximately the same as surface roughness Ra of sample No. 102. Thus, the coating layer has a smooth surface. Furthermore, in the plated substrate of sample No. 4, the thickness ratio ($t_2/t_3$) in the coating layer is 0.76, which is smaller than the thickness ratio of each of samples No. 101 and No. 102. Thus, the grain coating portion is thinner than the metal coating portion.

Furthermore, it turns out that the plated substrates of samples No. 1 to No. 4 each are obtained by etching a material plate formed of a composite material, which is then subjected to electroless plating in two steps.

For the plated substrates of samples No. 1 to No. 4, it is recognized that the surface of each substrate is rough to some extent, but the surface of the coating layer on each substrate is smooth, and a portion of the coating layer that coats each diamond grain existing as a surface of each substrate is relatively thin. These plated substrates of samples No. 1 to No. 4 each allow the joining material such as solder, grease and the like to be readily formed to have a uniform thickness on the coating layer, and also, can suppress a local increase in thermal resistance resulting from a locally thick portion of the joining material and the like. Furthermore, the coating layer located between the diamond grains and a semiconductor element, an installation target or the like can be reduced in thickness. Therefore, when the plated substrates of samples No. 1 to No. 4 each are used for a heat dissipation member or the like in the semiconductor element, each plated substrate is expected to achieve excellent thermal conductivity from the semiconductor element to the installation target.

Furthermore, samples No. 1 to No. 4, No. 101, and No. 102 were subjected to the following heat-resistance test to examine the adhesiveness of the coating layer. The heat-resistance test was conducted on two types of conditions including: a condition of a heating temperature of 400° C. and a retention time of 40 minutes; and a condition of a heating temperature of 780° C. and a retention time of 40 minutes. After the heat-resistance test, the bulging state of the coating layer was visually checked to count the number of composite members having bulges from among 100 composite members. Assuming that (number of occurrence of bulge/100)×100 was defined as a bulge occurrence ratio, the bulge occurrence ratio in each heat-resistance test was calculated. The results are shown in Table 1.

In sample No. 101, the bulge occurrence ratio at 400° C. is 90%, and the bulge occurrence ratio at 780° C. is 88%. In sample No. 102, the bulge occurrence ratio at 400° C. is 50%, and the bulge occurrence ratio at 780° C. is 90%. On the other hand, in sample No. 1, the bulge occurrence ratio at 400° C. is 5%, and the bulge occurrence ratio at 780° C. is 10%. In sample No. 2, the bulge occurrence ratio at 400° C. is 7%, and the bulge occurrence ratio at 780° C. is 12%. In sample No. 3, the bulge occurrence ratio at 400° C. is 6%, and the bulge occurrence ratio at 780° C. is 15%. In sample No. 4, the bulge occurrence ratio at 400° C. is 6%, and the bulge occurrence ratio at 780° C. is 15%. As recognized based on these results, even under a thermal history, the coating layer in each of samples No. 1 to No. 4 is less likely to peel off from the substrate than the coating layer in each of samples No. 101 and No. 102. One of the reasons why the above-mentioned results were obtained is considered that the plated substrates of samples No. 1 to No. 4 each could ensure a higher coating ratio of the coating layer over the diamond grains, which form the surface of the substrate, as compared with that of sample No. 102. Such the plated substrate of sample No. 1 is expected to allow a heat dissipation member that is excellent in thermal conductivity for a long period of time.

In addition, the plated substrate of sample No. 101 subjected to electroless plating in one step includes a material plate having a surface roughened to an extent similar to the surface of the material plate of sample No. 1. Thus, it is considered that a plating layer is isotropically formed on this roughened surface of the material plate to thereby increase the surface roughness of the plating layer The thickness of the plating layer in sample No. 101 is approximately uniform as shown in FIG. 12, and the portion coating each diamond grain is substantially equal in thickness to the portion coating a silver phase. It is considered that such sample No. 101 is inferior in thermal conductivity due to a locally thick portion formed in the joining material and the like when such sample No. 101 is used for a heat dissipation member in a semiconductor element.

It is considered that the plated substrate of sample No. 102 includes a coating layer with a relatively small surface roughness Ra in accordance with its relatively small ratio of protrusion height $L_2$ ($L_2/L$). In sample No. 102, however, the thickness of the plating layer is also approximately uniform as shown in FIG. 13, and the portion coating each diamond grain is substantially equal in thickness to the portion coating a silver phase. Furthermore, since the ratio of protrusion height $L_2$ ($L_2/L$) is relatively small, the coating ratio of the coating layer over the diamond grains is relatively small. Thus, as shown in the above-mentioned heat-resistance test results, the coating layer is more likely to peel off from the substrate as compared with samples No. 1 to No. 4.

The present disclosure is defined by the terms of the claims, but not limited to the above illustrative description, and is intended to include any modifications within the meaning and scope equivalent to the terms of the claims.

For example, in test example 1, the composition of the composite material, the grain size of each diamond grain, the content of the diamond grains, the composition and the thickness of the coating layer, and the film formation condition (etching condition, plating condition and the like) may be modified as appropriate.

REFERENCE SIGNS LIST

1 composite member, 10 substrate, 10f surface, 15 material plate, 16 rough surface plate, 17 partial coating plate, 2 coated grain, 20 diamond grain, 21 coating film, 2f protrusion, 3 metal phase, 3f surface, 4 coating layer, 4f, 40f surface, 5, 6 additional layer, 40 first plating layer, 41 second plating layer, 42 grain coating portion, 43 metal coating portion, 45 catalyst, 100 composite material, $t_2, t_3$ thickness.

The invention claimed is:

1. A composite member comprising:
   a substrate formed of a composite material containing
      a plurality of diamond grains, and
      a metal phase that bonds the diamond grains; and
   a coating layer made of metal and coating at least a part of a surface of the substrate, wherein
   the surface of the substrate includes
      a surface of the metal phase, and
         a protrusion formed of a part of at least one diamond grain of the diamond grains and protruding from the surface of the metal phase,
   in a plan view, the coating layer includes
      a metal coating portion coating the surface of the metal phase, and
      a grain coating portion coating the protrusion and not coating the surface of the metal phase,
   a ratio of a thickness of the grain coating portion to a thickness of the metal coating portion is greater than zero and equal to or less than 0.80,
   at least a part of a surface of the composite member has a surface roughness as an arithmetic mean roughness Ra of less than 2.0 μm,
   the diamond grains have a coating film that coats at least a part of a surface of each diamond grain, and
   the coating film is formed of a carbide of one or more types of metals selected from Ti, Hf, and Zr.

2. The composite member according to claim 1, wherein metal that forms the metal phase is silver or a silver alloy.

3. The composite member according to claim 1, wherein the metal that forms the coating layer is a nickel alloy containing phosphorus.

* * * * *